US007727893B2

(12) United States Patent
Min et al.

(10) Patent No.: US 7,727,893 B2
(45) Date of Patent: Jun. 1, 2010

(54) METHOD OF FORMING A DIELECTRIC LAYER PATTERN AND METHOD OF MANUFACTURING A NON-VOLATILE MEMORY DEVICE USING THE SAME

(75) Inventors: Jae-Ho Min, Seoul (KR); Dong-Hyun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/336,863

(22) Filed: Dec. 17, 2008

(65) Prior Publication Data
US 2009/0155968 A1 Jun. 18, 2009

(30) Foreign Application Priority Data
Dec. 18, 2007 (KR) ...................... 10-2007-0132997

(51) Int. Cl.
*H01L 21/311* (2006.01)
(52) U.S. Cl. ................ 438/695; 438/257; 257/E21.249
(58) Field of Classification Search .......... 257/E21.249, 257/E21.037; 438/295
See application file for complete search history.

(56) References Cited

U.S. PATENT DOCUMENTS

2006/0091445 A1 5/2006 Utsuno

2007/0184605 A1* 8/2007 Lee ............................ 438/211

FOREIGN PATENT DOCUMENTS

| KR | 1020060058812 A | 6/2006 |
| KR | 1020070090355 A | 9/2007 |
| KR | 784094 B1 * | 12/2007 |

* cited by examiner

Primary Examiner—W. David Coleman
Assistant Examiner—Shaka Scarlett
(74) Attorney, Agent, or Firm—Myers Bigel Sibley & Sajovec, P.A.

(57) ABSTRACT

In a method of forming a dielectric layer pattern, lower patterns are formed on a substrate. A first dielectric layer is formed on sidewalls and upper surfaces of the lower patterns and a surface of the substrate. A mask pattern is formed on the first dielectric layer to partially expose the first dielectric layer. The exposed first dielectric layer on upper surfaces and upper sidewalls of the lower patterns is partially removed and the removed first dielectric layer is deposited on surfaces of the first dielectric layer between the lower patterns, to form a second dielectric layer having a thickness greater than that of the first dielectric layer. The second dielectric layer on the sidewalls of the lower patterns and the substrate is etched to form a dielectric layer pattern. Accordingly, damage to the underlying layer may be reduced, and an unnecessary dielectric layer may be completely removed.

22 Claims, 18 Drawing Sheets

METHOD OF FORMING A DIELECTRIC LAYER PATTERN AND METHOD OF MANUFACTURING A NON-VOLATILE MEMORY DEVICE USING THE SAME

RELATED APPLICATION

This application claims priority under 35 U.S.C. §119 to Korean Patent Application No. 2007-132997, filed on Dec. 18, 2007 in the Korean Intellectual Property Office (KIPO), the contents of which are herein incorporated by reference in their entirety.

BACKGROUND

Example embodiments relate to a forming a dielectric layer pattern and a method of manufacturing a flash memory cell using the same. More particularly, example embodiments relate to forming a dielectric layer pattern including a metal oxide having a high dielectric constant and a method of manufacturing a flash memory cell using the same.

Semiconductor memory devices may be divided into volatile memory devices and non-volatile memory devices. A volatile memory device, e.g., a dynamic random access memory (DRAM) device or a static random access memory (SRAM) device, may have a relatively rapid access time but may lose stored data over time. On the other hand, a non-volatile memory device, e.g., a flash memory device or an electrically erasable programmable read-only memory (EEPROM) device, may store data for a long time but may have a relatively slow access time. Flash memory devices may be widely employed in various electronic devices, e.g., cellular phones, MP3 players, USB memory devices, and so forth.

In a conventional flash memory device, data may be electrically stored in or erased from the flash memory device through Fowler-Nordheim tunneling or channel hot electron injection. The flash memory device may be classified as either a floating gate type non-volatile memory device, or a SONOS (silicon oxide nitride oxide semiconductor or a MONOS (metal oxide nitride oxide semiconductor) type non-volatile memory device.

The floating gate type non-volatile memory device may include a tunnel oxide layer, a floating gate electrode, a blocking dielectric layer and a control gate electrode. For example, a multilayer dielectric layer including a lower silicon oxide layer, a silicon insulation layer and an upper silicon oxide layer may be used for the blocking dielectric layer.

Recently, in order to increase the capacitance of the blocking layer dielectric layer and improve leakage current properties, a method of forming the blocking dielectric layer using a high dielectric material has been presented. For example, the blocking dielectric layer may be formed using a metal oxide such as hafnium oxide, zirconium oxide, aluminum oxide, hafnium aluminum oxide, etc., having a higher dielectric constant than silicon nitride.

In order to form a gate structure including the blocking dielectric layer with the high dielectric material, a patterning process of patterning the control gate electrode layer, the blocking dielectric layer and the floating gate electrode may be performed. However, an anisotropic etch process may not be easily performed over the blocking dielectric layer having the high dielectric material.

Accordingly, the blocking dielectric layer may not be easily removed with a high etch rate, without damaging adjacent other layers. Further, during the etching process for etching the blocking dielectric layer, a microloading effect may be large, so that an etch rate of the blocking dielectric layer may differ greatly from an etch rate of the adjacent exposed layers. Further, because the blocking dielectric layer may be conformally formed on an upper surface and sidewalls of the floating gate electrode, portions of the blocking dielectric layer, which is formed on the sidewalls of the floating gate electrode, to be etched by the anisotropic process may be very thick. Accordingly, it may not be easy to completely remove the blocking dielectric layer through the anisotropic etch process, without damaging adjacent layers.

On the other hand, if the blocking dielectric layer to be removed still remains after performing the dry etch process, the floating gate electrode under the remaining blocking dielectric layer may not be removed by a following process, to thereby cause a stringer failure where adjacent cells short one another. Further, if the blocking dielectric layer is excessively etched to completely remove the blocking dielectric layer, the floating gate electrode and the isolation layer may be excessively etched, thereby damaging the middle portion of an active region under the floating gate electrode and the peripheral portion of the active region on both sides of the isolation layer pattern.

Therefore, a method of patterning a gate structure of a non-volatile memory device using a high dielectric material as the blocking dielectric layer and capable of reducing damage to the active region or a stringer is desired.

SUMMARY

Exemplary embodiments provide a method of forming a blocking dielectric layer pattern including a high dielectric material.

Exemplary embodiments provide a method of manufacturing a cell of a flash memory including the blocking dielectric layer pattern.

According to some embodiments, a method of forming a dielectric layer pattern includes forming lower patterns on a substrate. A first dielectric layer is formed on sidewalls and upper surfaces of the lower patterns and a surface of the substrate. A mask pattern is formed on the first dielectric layer to partially expose the first dielectric layer. The exposed first dielectric layer on upper surfaces and upper sidewalls of the lower patterns is partially removed and the removed first dielectric layer is deposited on surfaces of the first dielectric layer between the lower patterns, to form a second dielectric layer having a thickness greater than that of the first dielectric layer from the substrate. The second dielectric layer on the sidewalls of the lower patterns and the substrate is etched to form a dielectric layer pattern under the mask pattern.

In some embodiments, the first dielectric layer may include a metal oxide having a greater dielectric constant than silicon nitride. The first dielectric layer may include aluminum oxide, hafnium oxide, zirconium oxide, etc. These may be used alone or as a combination thereof.

In some embodiments, an argon sputtering process may be performed over the first dielectric layer to form the second dielectric layer. The argon sputtering process may be performed under a pressure of about 20 mTorr to about 40 mTorr and at a bias voltage of about 100 V to about 900 V.

In some embodiments, the second dielectric layer may be anisotropically etched.

In some embodiments, the second dielectric layer may be etched using an etching gas including chlorine ($Cl_2$), boron trichloride ($BCl_3$), hydrogen bromide (HBr), etc. These etching gases may be used alone or in a combination thereof.

In some embodiments, a process for forming the second dielectric layer and a process for etching the second dielectric layer may be sequentially performed repeatedly.

According to some embodiments, a method of manufacturing a non-volatile memory device includes forming a tunnel oxide layer and a conductive layer pattern on a substrate. A first dielectric layer is formed on a surface of the conductive layer pattern and a surface of the substrate. A control gate electrode is formed on the first dielectric layer. The exposed first dielectric layer on an upper surface and upper sidewalls of the conductive layer pattern between the control gate electrodes is partially removed and the removed first dielectric layer is deposited on a surface of the first dielectric layer between the conductive layer patterns, to form a second dielectric layer having a thickness greater than that of the first dielectric layer from the substrate. The second dielectric layer on the sidewalls of the conductive layer pattern and the substrate is etched to form a dielectric layer pattern. The exposed conductive layer pattern between the control gate electrodes is etched to form a floating gate electrode.

In some embodiments, the method may further include forming an isolation layer pattern in the substrate between the conductive layer patterns.

In some embodiments, to form the isolation layer pattern, the substrate between the conductive layer patterns may be etched to form an isolation trench. The trench and a gap between the conductive layer patterns may be filled with an insulation layer to form a preliminary isolation layer pattern. The preliminary isolation layer pattern may be etched to partially expose the sidewalls of the conductive layer patter to form the isolation layer pattern.

In some embodiments, the method may further include forming a wing spacer on the isolation layer pattern to partially cover the sidewalls of the conductive layer pattern.

In some embodiments, the method may further include partially removing the isolation layer pattern, after forming the dielectric layer pattern.

In some embodiments, the first dielectric layer may include a metal oxide having a greater dielectric constant than silicon nitride. The first dielectric layer may include aluminum oxide, hafnium oxide, zirconium oxide, etc. These may be used alone or in a combination thereof.

Alternatively, silicon oxide, the metal oxide and silicon oxide may be sequentially stacked to form the first dielectric layer.

In some embodiments, forming the second dielectric layer may include performing an argon sputtering process over the first dielectric layer.

In some embodiments, etching the second dielectric layer may include anisotropically etching the second dielectric layer.

In some embodiments, the second dielectric layer may be etched using an etching gas including chlorine ($Cl_2$), boron trichloride ($BCl_3$), hydrogen bromide (HBr), etc. These etching gases may be used alone or as a combination thereof.

In some embodiments, forming the floating gate electrode may include performing a dry etch process using an etching gas including a series of fluorocarbon over the conductive layer pattern.

Examples of the etching gas including a series of fluorocarbon may be carbon tetrafluoride ($CF_4$), difluoromethane ($CH_2F_2$) and octafluorocyclobutane ($C_4F_8$). These etching gases may be used alone or as a combination thereof.

In some embodiments, a process for forming the second dielectric layer and a process for etching the second dielectric layer may be sequentially performed repeatedly, before forming the floating gate pattern.

According to some embodiments, a dielectric layer conformally formed on lower patterns may be effectively removed to form a dielectric layer pattern without damaging a substrate and lower patterns. Further, the method of forming the dielectric layer pattern may be used to manufacture a cell of a non-volatile memory device, to thereby reduce process failures due to the dielectric layer that unnecessarily remains between dielectric layer patterns. Further, the dielectric layer pattern having a high dielectric constant may be used in the cell of the non-volatile memory device, to thereby increase the coupling ratio of the non-volatile memory device.

BRIEF DESCRIPTION OF THE DRAWINGS

Exemplary embodiments will be more clearly understood from the following detailed description taken in conjunction with the accompanying drawings.

FIGS. 1 to 6 are perspective views illustrating a method of forming a dielectric layer pattern in accordance with a first exemplary embodiment.

FIGS. 7 and 8 are perspective views illustrating a method of forming a dielectric layer pattern in accordance with a second exemplary embodiment.

FIGS. 9 to 13 are cross-sectional views illustrating a method of forming a cell of a non-volatile semiconductor memory device in accordance with a third exemplary embodiment.

FIGS. 14 to 19 are perspective views illustrating a method of forming a cell of a non-volatile semiconductor memory device in accordance with a third exemplary embodiment.

FIGS. 20 to 24 are perspective views illustrating a method of forming a cell of a non-volatile memory device in accordance with a fifth exemplary embodiment.

DETAILED DESCRIPTION OF THE EMBODIMENTS

Figure 1:
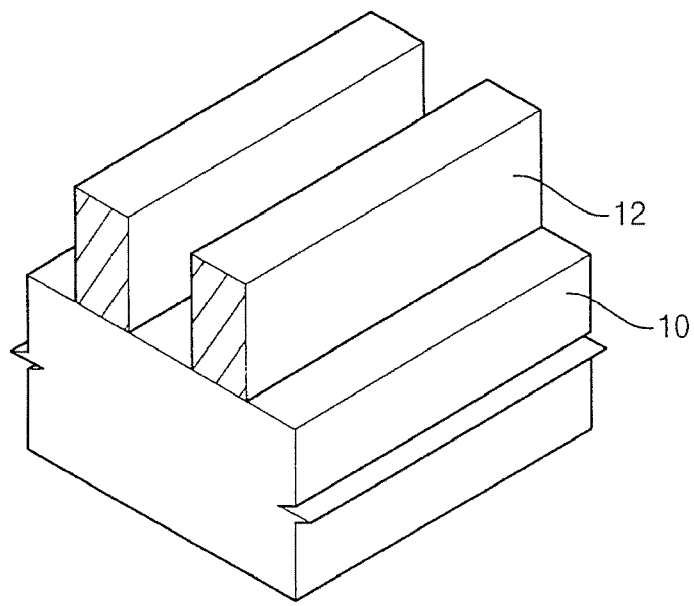
FIGS. 1 to 24 represent non-limiting, exemplary embodiments as described herein.

Various embodiments will be described more fully hereinafter with reference to the accompanying drawings, in which some embodiments are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, the present invention should not be construed as limited to the particular shapes of regions illustrated herein. Embodiments of the present invention are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

Embodiment I

FIGS. 1 to 6 are perspective views illustrating a method of forming a dielectric layer pattern in accordance with a first embodiment of the present invention.

Referring to FIG. 1, lower patterns 12 are formed on a substrate 10. The lower pattern 12 may include a conductive material. The lower patterns 12 may have line shapes that are spaced apart from one another.

As illustrated in FIG. 1, the lower patterns 12 may be formed to make contact with the substrate 10. Alternatively, the lower patterns 12 may be formed on an interlayer that is formed on the substrate 10 without making contact with the substrate 10.

Figure 2:
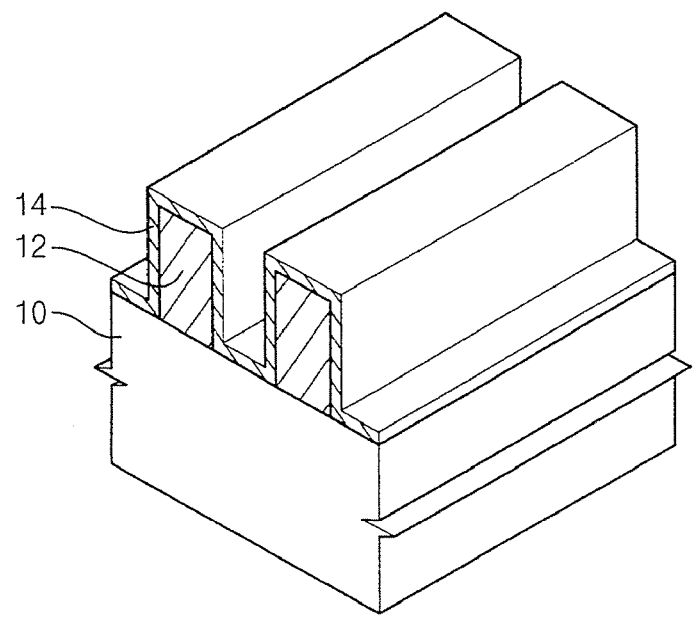

Referring to FIG. 2, a first dielectric layer 14 is formed on sidewalls and upper surfaces of the lower patterns 12 and a surface of the substrate 10 between the lower patterns 12. The first dielectric layer 14 may be conformally formed to have a small thickness so as not to fill a gap between the lower patterns 12, as illustrated in FIG. 2.

A metal oxide may be deposited on the substrate 10 to form the first dielectric layer 14. The metal oxide may have a greater dielectric constant than silicon nitride. Examples of the metal oxide may be aluminum oxide, hafnium oxide, zirconium oxide, etc. These may be used alone or as a combination thereof.

Alternatively, silicon oxide, a metal oxide having a high dielectric constant and silicon oxide may be sequentially deposited on the substrate 10 to form the first dielectric layer 14.

Figure 3:
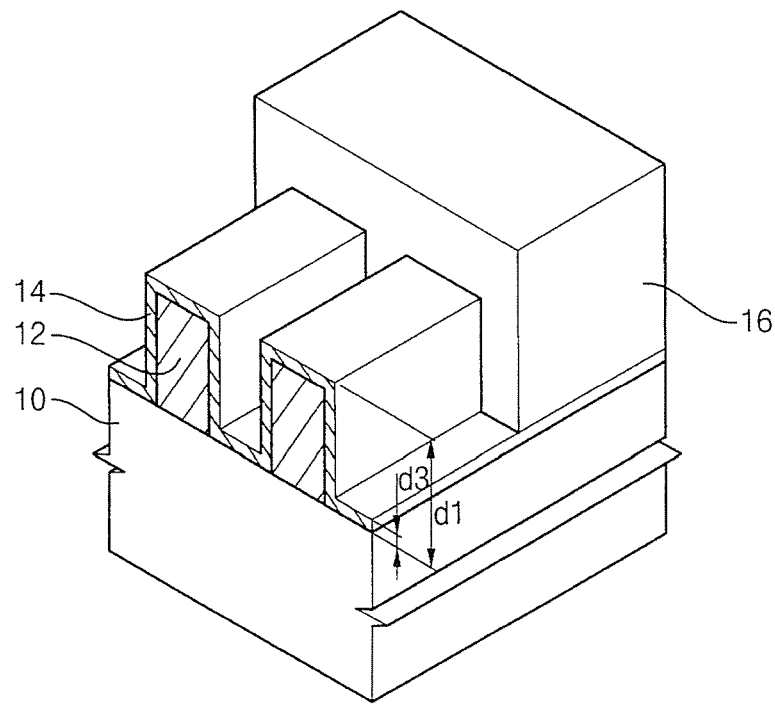

Referring to FIG. 3, an etch mask pattern 16 is formed on the first dielectric layer to partially cover the first dielectric layer 14. The etch mask pattern 16 may selectively cover a portion of the first dielectric layer 14 where a dielectric layer pattern is formed. In this embodiment, the etch mask pattern 16 may have a line shape extending in a direction substantially perpendicular to an extending direction of the lower pattern 12. The etch mask pattern 16 may have silicon nitride or silicon oxide. The silicon nitride or the silicon oxide may be deposited by a chemical vapor deposition (CVD) process and patterned by a photolithography process to form the etch mask pattern 16.

Figure 4:
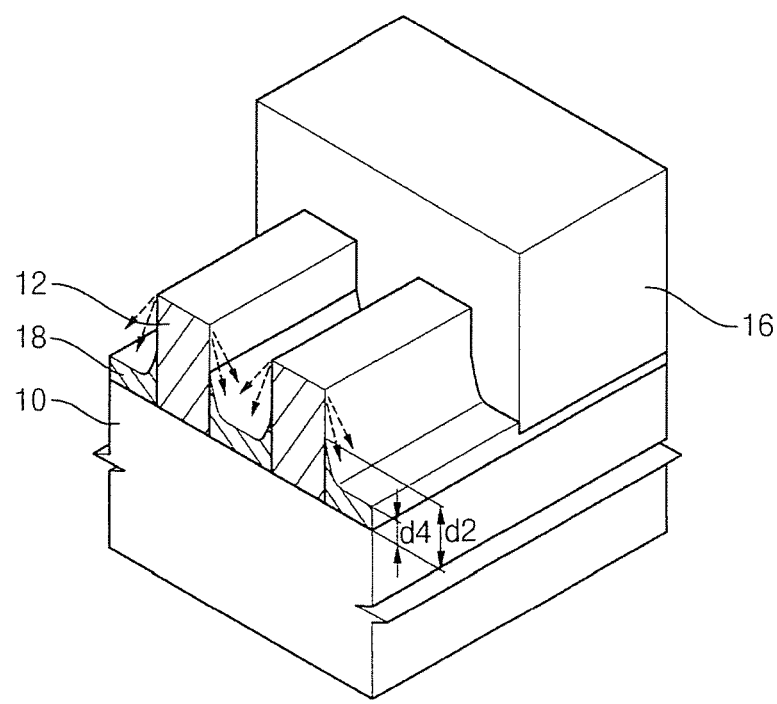

Referring to FIG. 4, the first dielectric layer 14 is partially removed using the etch mask pattern 16 as an etch mask and portions of the removed first dielectric layer 14 are deposited on surfaces of the first dielectric layer 14 between the lower patterns 12, to form a second dielectric layer 18 having a thickness greater than that of the first dielectric layer 14. Portions of the first dielectric layer 14 formed on the upper surfaces and upper sidewalls of the lower patterns 12 are almost removed to form the second dielectric layer 18.

The second dielectric layer 18 may be formed by an argon sputtering process. As mentioned above, when the sputtering process may be performed using argon ions over the substrate 10 including the first dielectric layer 14, the first dielectric layer 14 is partially removed and the partially removed portion of the first dielectric layer 14 is deposited again to form the second dielectric layer 18. The argon sputtering process may be performed under a pressure of about 20 mTorr to about 40 mTorr and at a bias voltage of about 100 V to about 900 V.

By the sputtering process, the first dielectric layer 14 only on lower sidewalls of the lower pattern 12 remains, whereas the first dielectric layer 14 on the upper surfaces and the upper sidewalls of the lower patterns 12 are almost removed. Accordingly, the second dielectric layer 18 on the sidewalls of the lower pattern 12 has a vertical thickness d2 smaller than a vertical thickness d1 (see FIG. 3) of the first dielectric layer 14. Also, because the removed first dielectric layer 14 is deposited again, the second dielectric layer 18 between the lower patterns 12 has a thickness d4 greater than a thickness d3 of the first dielectric layer 14.

Figure 5:
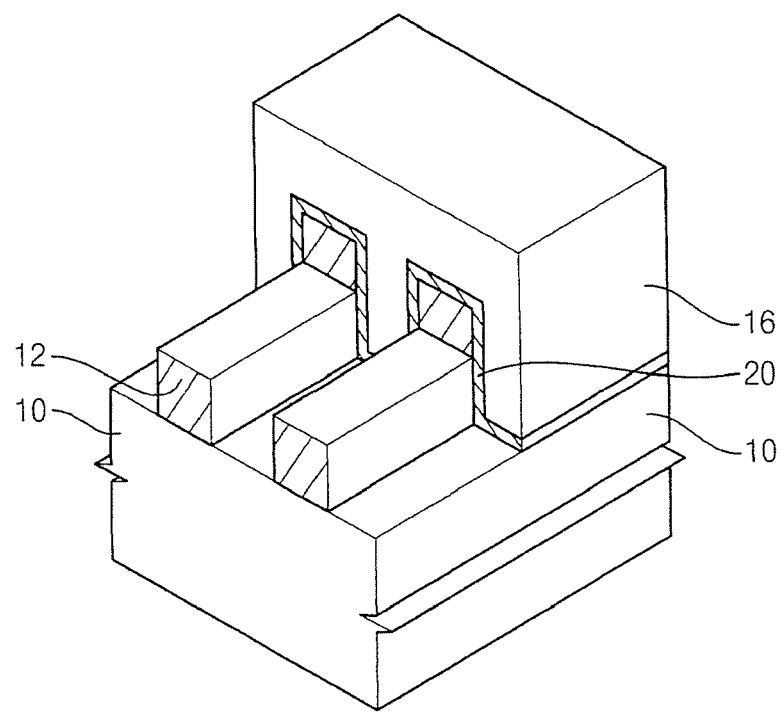

Referring to FIG. 5, the second dielectric layer 18 may be etched by an anisotropic etch process to leave the dielectric layer only under the etch mask pattern, to form a dielectric layer pattern 20. The second dielectric layer 18 may be formed by a dry etch process. The dry etch process may be performed using an etching gas of chlorine ($Cl_2$) gas and boron trichloride ($BCl_3$) gas. These gases may be used alone or as a combination thereof. For example, the chlorine ($Cl_2$) gas and the boron trichloride ($BCl_3$) gas may be used for a main etching gas and hydrogen bromide (HBr) gas may be selectively used for an additional etching gas.

By the etch process, the second dielectric layer 18 formed on the sidewalls of the lower pattern 12 and between the lower patterns 12 are etched. The second dielectric layer 18 on the sidewalls of the lower pattern 12 has a relatively small vertical thickness and the second dielectric layer 18 between the lower patterns 12 has a relatively great thickness, compared with the first dielectric layer 14. Therefore, although the second dielectric layer 18 is excessively etched to completely remove the second dielectric layer 18, the substrate 10 between the lower patterns 12 may be prevented from being damaged. Thus, when the dielectric layer pattern 20 is formed, damage to the adjacent patterns and the substrate may be prevented.

On the other hand, when the dielectric layer pattern 20 is formed, the exposed lower patterns 12 are etched together. Accordingly, the height of the lower pattern 12 becomes smaller.

Figure 6:
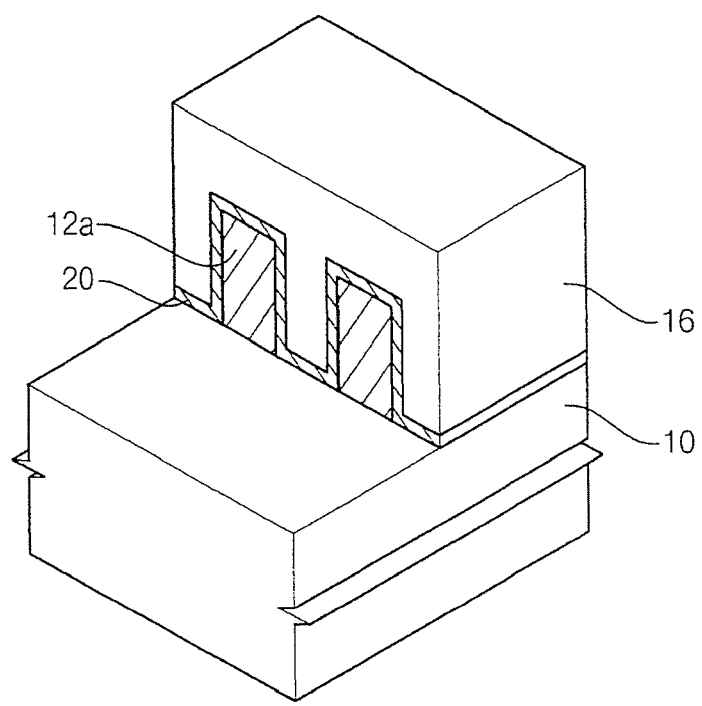

Referring to FIG. 6, the exposed lower patterns 12 are removed to form a lower pattern 12a only under the dielectric layer pattern 20.

Embodiment II

Figure 7:
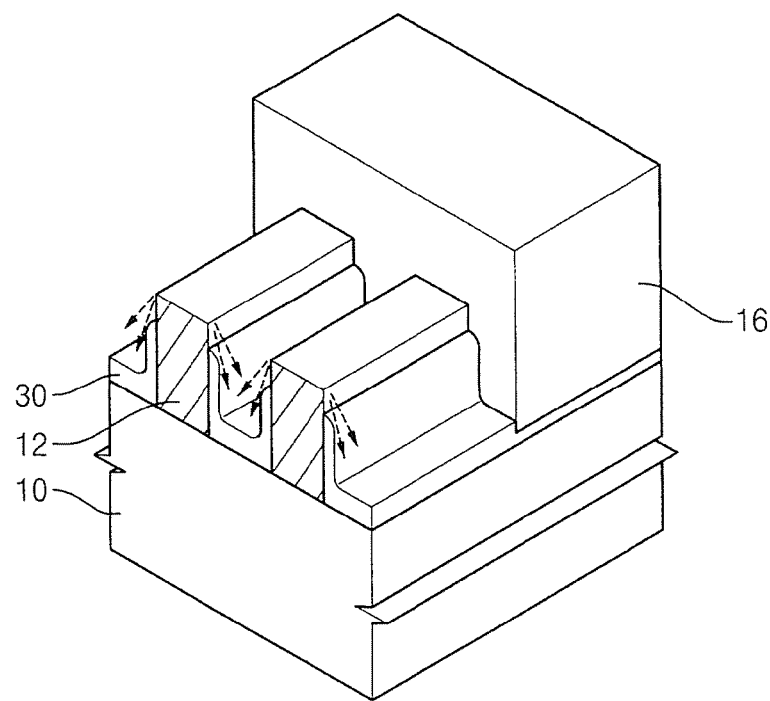
Figure 8:
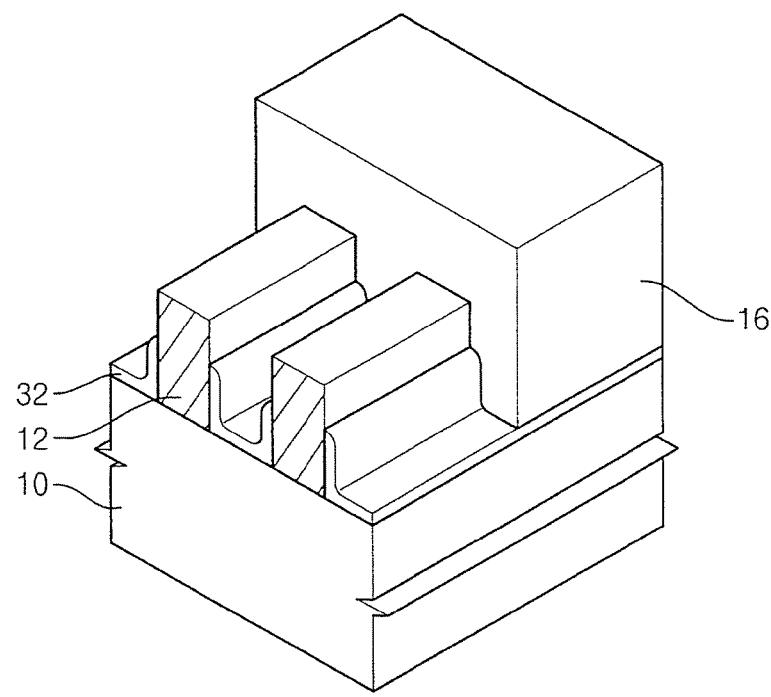

FIGS. 7 and 8 are perspective views illustrating a method of forming a dielectric layer pattern in accordance with a second embodiment of the present invention.

A method of forming a second dielectric layer pattern according to this second embodiment is the same as the first embodiment, except that an argon sputtering process and an anisotropic etch process are performed repeatedly over the first dielectric layer.

First, the same processes as illustrated in FIGS. 1 to 3 are performed to form a first dielectric layer 14 on lower patterns 12 and a substrate between the lower patterns 12. An etch mask pattern 16 is formed on the first dielectric layer 14 to partially cover the first dielectric layer 14.

Referring to FIG. 7, by an argon sputtering process, the exposed first dielectric layer 14 is partially removed using the etch mask pattern 16 as an etching mask and the removed first dielectric layer 14 is deposited again on the first dielectric layer 14 between the lower patterns 12 to form a first preliminary dielectric layer pattern 30. The first dielectric layer 14 on upper surfaces and sidewalls of the lower patterns 12 are partially removed. In this embodiment, a vertical thickness of the first preliminary dielectric layer pattern 30 on upper sidewalls of the lower patterns 12 becomes smaller and a thickness of the first preliminary dielectric layer pattern 30 on the substrate 10 between the lower patterns 12 becomes greater.

Referring to FIG. 8, a portion of the first dielectric layer 14 is anisotropically etched to form a second preliminary dielectric layer pattern 32. After the first dielectric layer 14 is partially removed, the second preliminary dielectric layer pattern 32 that remains between the lower patterns 12 may preferably have a predetermined thickness.

The vertical thickness of the first preliminary dielectric layer pattern 30 on the sidewalls of the lower pattern 12 becomes smaller by the argon sputtering process. However, the vertical thickness of the first preliminary dielectric layer pattern 30 on the sidewalls of the lower patterns 12 are larger than the thickness of the first preliminary dielectric layer pattern 30 between the lower patterns 12. Accordingly, if the first preliminary dielectric layer pattern 30 on the sidewalls of the lower patterns 12 are excessively etched to be completely removed, the first preliminary dielectric layer pattern 30 between the lower patterns 12 are removed, and thus, the substrate 10 is exposed and can be damaged. Therefore, the anisotropic etch process may be preferably performed over the first preliminary dielectric layer pattern 30 so that the first preliminary dielectric layer pattern remains between the lower patterns 12 to have a predetermined thickness.

Although not illustrated in the figures, the argon sputtering process and the anisotropic etch process may be performed repeatedly to completely remove the exposed second preliminary dielectric layer pattern 32. Accordingly, as illustrated in FIG. 6, the second dielectric layer pattern 20 is formed under the etch mask pattern 16.

When the argon sputtering process and the anisotropic etch process are performed repeatedly, damage to the exposed substrate 10 between the lower patterns may be reduced. Additionally, it may be reduced that an etch rate of the first dielectric layer on the lower patterns having a relatively high density differs from that on the lower patterns having a relatively low density during an etch process (microloading effect).

Embodiment III

FIGS. 9 to 13 are cross-sectional views illustrating a method of forming a cell of a non-volatile semiconductor memory device in accordance with a third embodiment of the present invention. FIGS. 14 to 19 are perspective views illustrating a method of forming a cell of a non-volatile semiconductor memory device in accordance with a third embodiment of the present invention.

Figure 9:
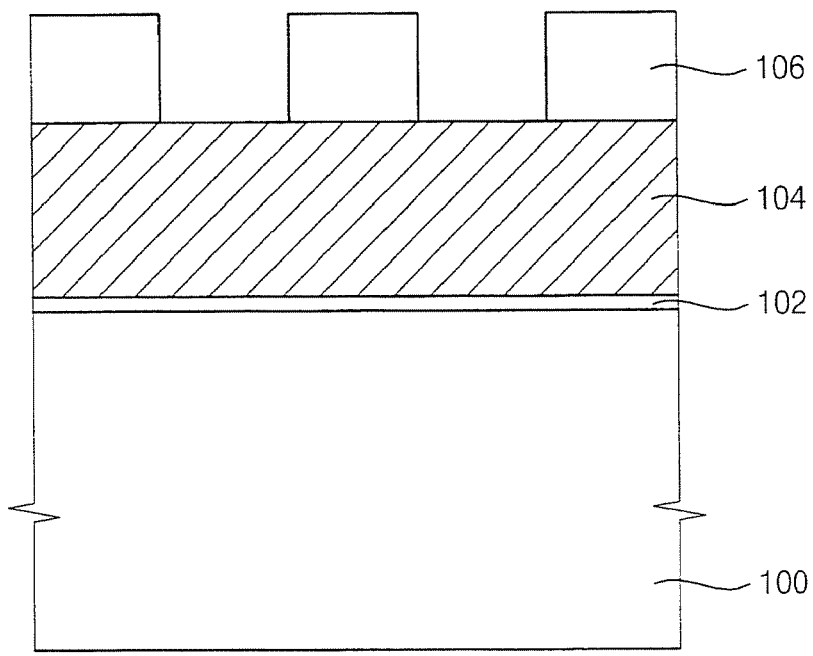

Referring to FIG. 9, a tunnel oxide layer 102 is formed on a substrate 100. The substrate 100 may include a semiconductor material such as single-crystalline silicon.

The tunnel oxide layer 102 may have a thickness of from about 30 Å to about 90 Å, and preferably about 60 Å. The tunnel oxide layer 102 may be formed by a thermal oxidation process.

A first conductive layer 104 to be used for a floating gate electrode is formed on the tunnel oxide layer 102. The first conductive layer 104 may include a doped polysilicon. After a polysilicon layer is formed on the tunnel oxide layer 102, impurities may be doped into the polysilicon layer to form the first conductive layer 104. For example, the polysilicon layer may have a thickness of from about 300 Å to about 700 Å, and preferably about 500 Å.

A first hard mask layer (not illustrated) may be formed on the first conductive layer 104 by a low-pressure chemical vapor deposition (LPCVD) process. The first hard mask layer may be formed using a material having an etch selectivity with respect to the first conductive layer 104, the tunnel oxide layer 102 and the substrate 100. For example, the first hard mask layer may include silicon nitride or silicon oxynitride.

After a first photoresist film (not illustrated) is coated on the first hard mask layer, the first photoresist film is exposed and developed to form a first photoresist pattern (not illustrated) on the first hard mask layer. The first photoresist pattern may be formed to selectively cover an active region of the substrate 100. For example, the first photoresist pattern may have line shapes extending in a first direction. The line shapes of the first photoresist pattern are spaced apart from one other.

The first hard mask layer is etched using the first photoresist pattern as an etching mask to form a first hard mask pattern 106. Then, the first photoresist pattern may be removed by an ashing and/or stripping process.

Figure 10:
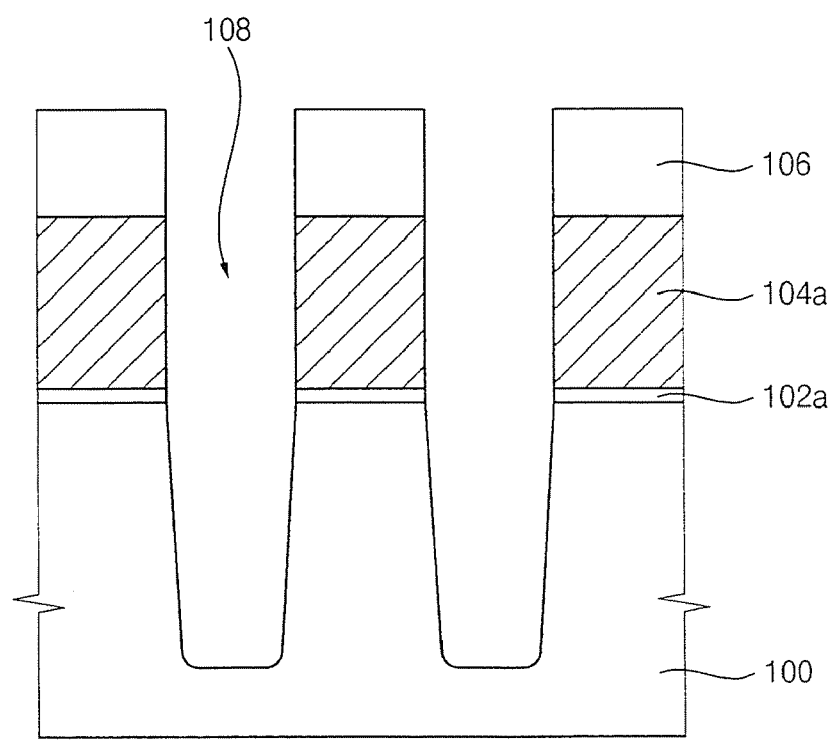

Referring to FIG. 10, the first conductive layer 104 and the tunnel oxide layer 102 are sequentially etched using the first hard mask pattern 106 as an etching mask to form a first conductive layer pattern 104a and a tunnel oxide layer pattern 102a on the substrate 100. Then, the substrate 100 exposed by the first conductive layer pattern 104a is partially etched to form a trench 108 in the substrate 100.

Figure 11:
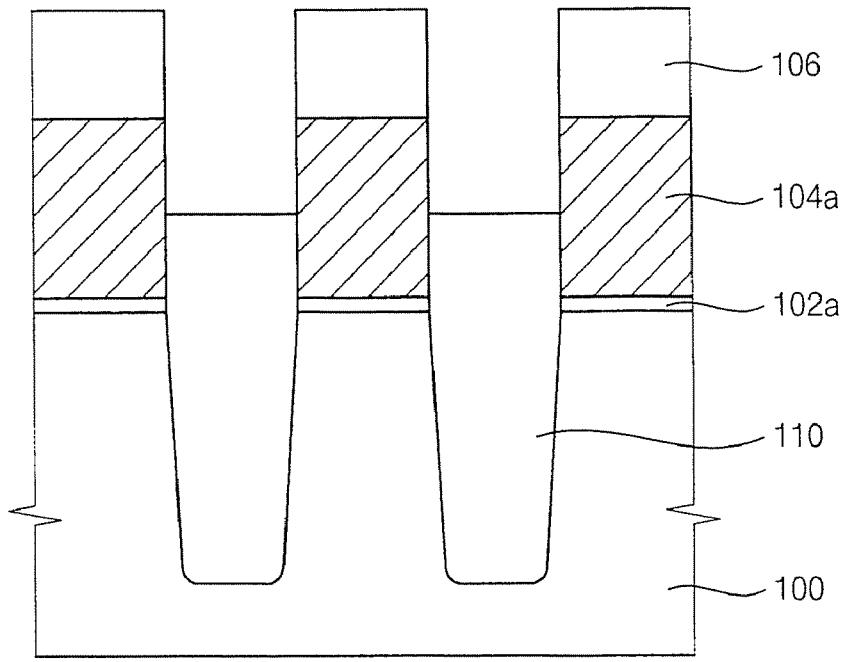

Referring to FIG. 11, after an insulation layer is formed to completely fill the trench 108, the insulation layer is planarized to form a preliminary insulation layer pattern (not illustrated). The insulation layer may be planarized by a chemical mechanical polishing (CMP) process, an etch-back process, or a process in a combination thereof.

An oxide having excellent gap-fill characteristics may be deposited by a CVD process to sufficiently fill the trench 108 having a relative narrow width, to form the insulation layer. For example, the insulation layer may be formed by a high-density plasma chemical vapor deposition (HDP-CVD) process. Then, the insulation layer may be removed by a CMP process, an etch-back process, or a process in a combination thereof until the first hard mask pattern 106 is exposed, to form a preliminary insulation layer pattern.

Then, the preliminary insulation layer pattern is anisotropically etched to form an insulation layer pattern 110 having a thickness less than that of the preliminary insulation layer pattern. Preferably, an upper surface of the insulation layer pattern 110 may be lower than an upper surface of the first conductive layer pattern 104a and may be higher than a lower surface of the first conductive layer pattern 104a. For example, the upper surface of the insulation layer pattern 110 may be positioned between the middle of the first conductive layer pattern 104a and the lower surface of the first conductive layer pattern 104. Accordingly, the first conductive layer pattern 104a partially protrudes from a side of the insulation layer pattern 110.

Figure 12:
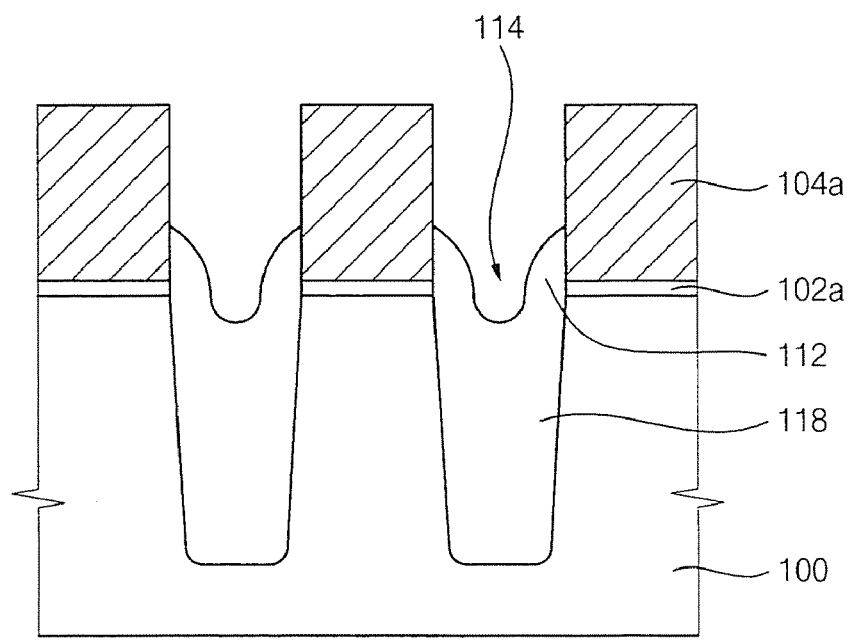

Referring to FIG. 12, an insulation layer for a spacer (not illustrated) is formed on surfaces of the insulation layer pattern 110, the first conductive layer pattern 104a and the first hard mask pattern 106. Silicon oxide may be deposited by a CVD process to form the insulation layer for a spacer.

The insulation layer for a spacer is anisotropically etched to form a wing spacer 112 on lower sidewalls of the first conductive layer pattern 104a. When the insulation layer for a space is anisotropically etched, the insulation layer pattern 110 is partially removed together. Thus, as illustrated in FIG. 12, a recess 114 is formed in the insulation layer pattern 110 between the first conductive pattern 104a, and only the lower sidewalls of the first conductive layer pattern 104a is covered with the wing spacer 112. The wing spacer 112 may cover the lower sidewalls of the first conductive layer pattern 104a such that peripheral portions of the active region is not exposed by the wing spacer 112 during a following process, thereby preventing damage to the peripheral portions of the active region.

Accordingly, the process is performed to form an isolation layer pattern 118 including the wing spacer 112.

Then, the first hard mask pattern 106 is removed to expose the upper surface of the first conductive layer pattern 104a.

Figure 13:
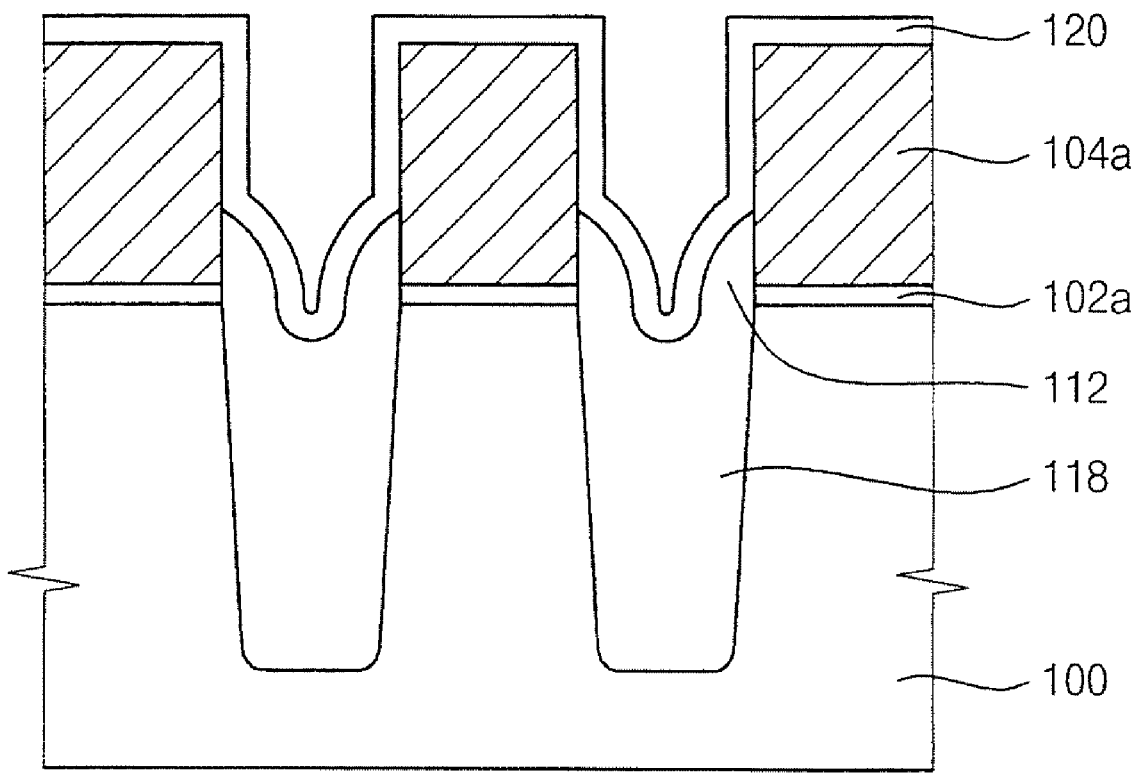

Referring to FIG. 13, a first dielectric layer 120 is formed on the first dielectric layer pattern 104a and the isolation layer pattern 118 including the wing spacer 112. The first dielectric layer 120 may be formed using a metal oxide having a dielectric constant greater than silicon nitride. The metal oxide may be aluminum oxide, hafnium oxide, zirconium oxide, etc.

Alternatively, silicon oxide, a metal oxide having a high dielectric constant and silicon oxide may be sequentially deposited on the first dielectric layer pattern 104a and the isolation layer pattern 118 including the wing spacer 112 to form the first dielectric layer 120.

Figure 14:
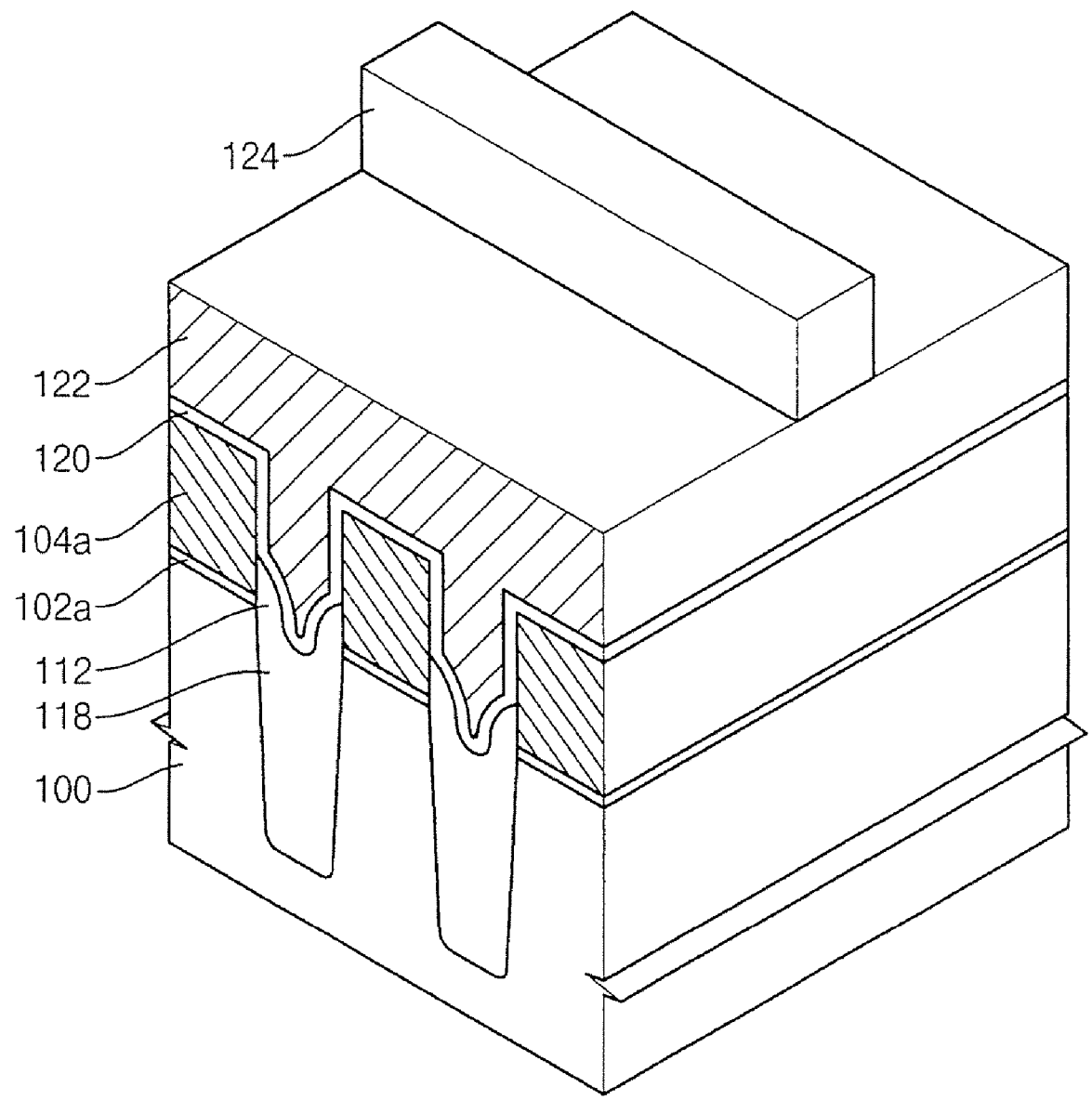

Referring to FIG. 14, a second conductive layer 122 to be used for a control gate electrode is formed on the first dielectric layer 120. The second conductive layer 122 may include a doped polysilicon, a metal, a metal silicide material, etc. These may be used alone or in combination thereof. In this embodiment, a doped polysilicon layer and a tungsten silicide layer are sequentially formed on the first dielectric layer 120 to form the second conductive layer 122.

A second hard mask layer (not illustrated) may be formed on the second conductive layer 122. The second hard mask layer may include silicon nitride or silicon oxynitride. For example, the second hard mask layer may be formed using silicon oxide by a plasma-enhanced chemical vapor deposition (PECVD) process.

After a second photoresist film (not illustrated) is coated on the second hard mask layer, the second photoresist film is patterned by an exposure process and a development process to form a second photoresist pattern (not illustrated) on the second hard mask layer. For example, the second photoresist pattern may have line shapes extending in a second direction perpendicular to the first direction. The second direction may be perpendicular to the extending direction of the active region.

Then, the second hard mask layer is etched using the second photoresist pattern as an etching mask to form a second hard mask pattern 124 on the second conductive layer 122. The second photoresist pattern may be removed by an ashing process and/or stripping process.

Figure 15:
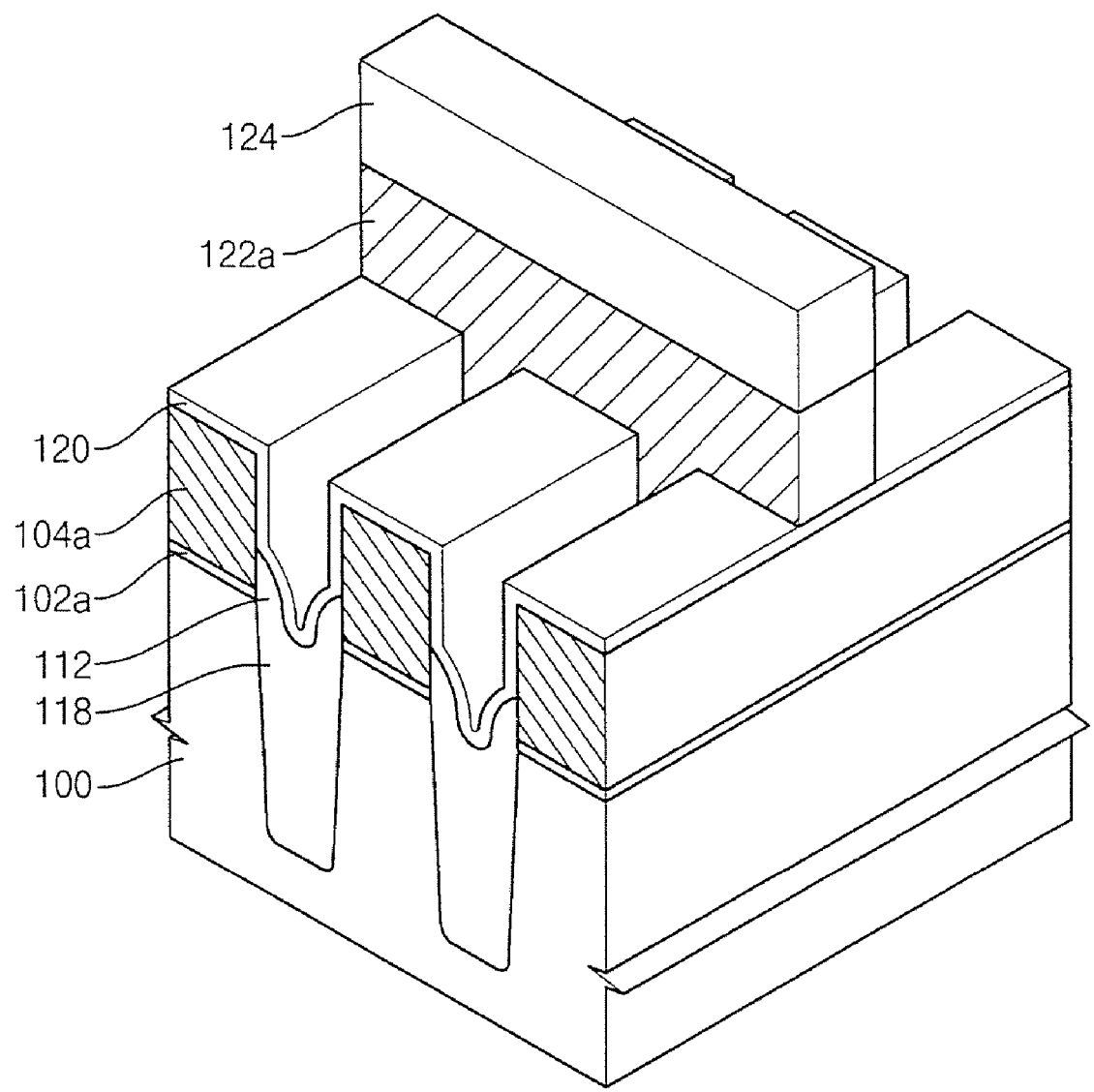

Referring to FIG. 15, the second conductive layer 122 is etched using the second hard mask pattern 124 as an etching mask to form a control gate electrode 122a. When the second conductive layer 122 is etched, the first dielectric layer 120 between the control gate electrodes 122a is exposed.

Figure 16:
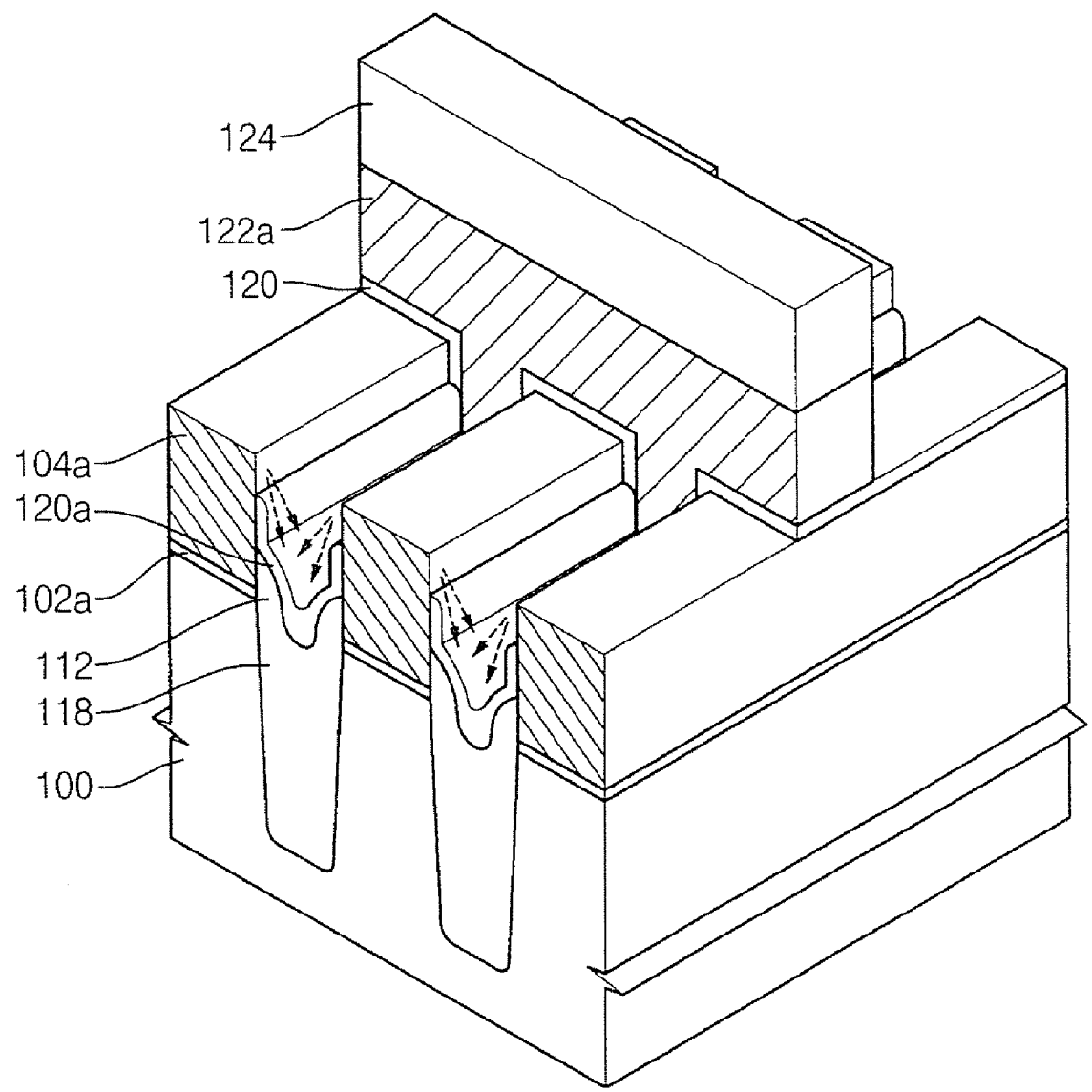

Referring to FIG. 16, the exposed first dielectric layer 120 is partially removed and the removed first dielectric layer is deposited on the first dielectric layer 120 between the first conductive layer pattern 104a to form a second dielectric layer 120a having a relatively greater thickness between the first conductive layer pattern 104a. Portions of the first dielectric layer 120 formed on an upper surface and upper sidewalls of the first conductive layer pattern 104a are almost removed to form the second dielectric layer 120a.

The second dielectric layer 120a may be formed by an argon sputtering process. The argon sputtering process may be performed under a pressure of about 20 mTorr to about 40 mTorr and at a bias voltage of about 100 V to about 900 V.

By the sputtering process, a vertical thickness of the second dielectric layer 120a on the sidewalls of the first conductive layer pattern 104a is smaller than a vertical thickness of the first dielectric layer 120 on the sidewalls of the first conductive layer pattern 104a. A thickness of the second dielectric layer 120a between the first conductive layer patterns 104a may be greater than a thickness of the first dielectric layer 120 between the first conductive layer patterns 104a. Also, the first dielectric layer 120 on the upper surfaces and the upper sidewalls of the first conductive layer pattern 104a is almost removed.

On the other hand, when the dielectric layer 120 is etched, the exposed first conductive layer patterns 104a may be etched together.

Figure 17:
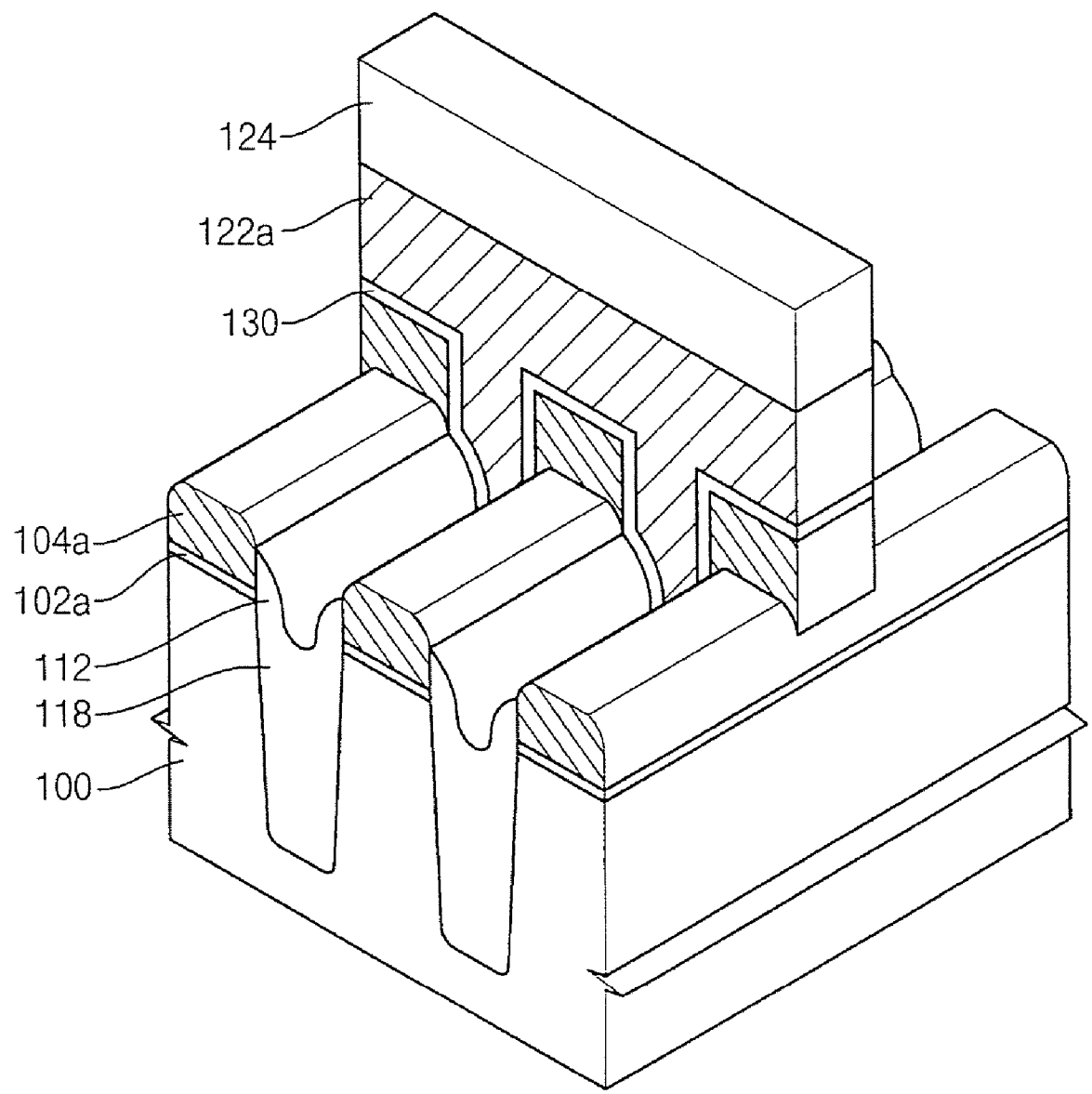

Referring to FIG. 17, the exposed second dielectric layer 120a may be etched by an anisotropic etch process to form a dielectric layer pattern 130 under the control gate electrode 122a. The second dielectric layer 120a may be formed by a dry etch process. The dry etch process may be performed using an etching gas of chlorine ($Cl_2$) gas and boron trichloride ($BCl_3$) gas. These gases may be used alone or in a combination thereof. For example, the chlorine ($Cl_2$) gas and the boron trichloride ($BCl_3$) gas may be used for a main etching gas and hydrogen bromide (HBr) gas may be selectively used for an additional etching gas.

By the anisotropic etch process, the second dielectric layer 120a formed on the sidewalls of the first conductive layer pattern 104a and between the first conductive layer patterns 104a is etched. The second dielectric layer 120a on the sidewalls of the first conductive layer pattern 104a has a relatively small vertical thickness and the second dielectric layer 120a between the first conductive layer patterns 104a has a relatively great thickness. Therefore, although the second dielectric layer 120a is excessively etched to completely remove the second dielectric layer 120a formed on sidewalls of the first conductive layer pattern 104a, the isolation layer pattern 118 including the wing spacer 112 between the first conductive layer patterns 104a may not be excessively etched.

Accordingly, the isolation layer pattern 118 may not be excessively etched, so that an active pitting effect due to a damage of a peripheral region of the active region may be reduced.

When the second dielectric layer 120a is etched, the first conductive layer pattern 104a may be partially etched together. In particular, when the first conductive layer pattern 104a is excessively etched during the etch process, a middle portion of the active region may be damaged. However, because the second dielectric layer 120a on the sidewalls of the first conductive layer pattern 104a has the relative small vertical thickness, a process time for etching the second dielectric layer 120a may be reduced. Accordingly, since the thickness of the first conductive layer pattern 104a to be etched is reduced, the active region of the substrate may be prevented from being damaged due to an excessive etch of the first conductive layer pattern 104a.

Figure 18:
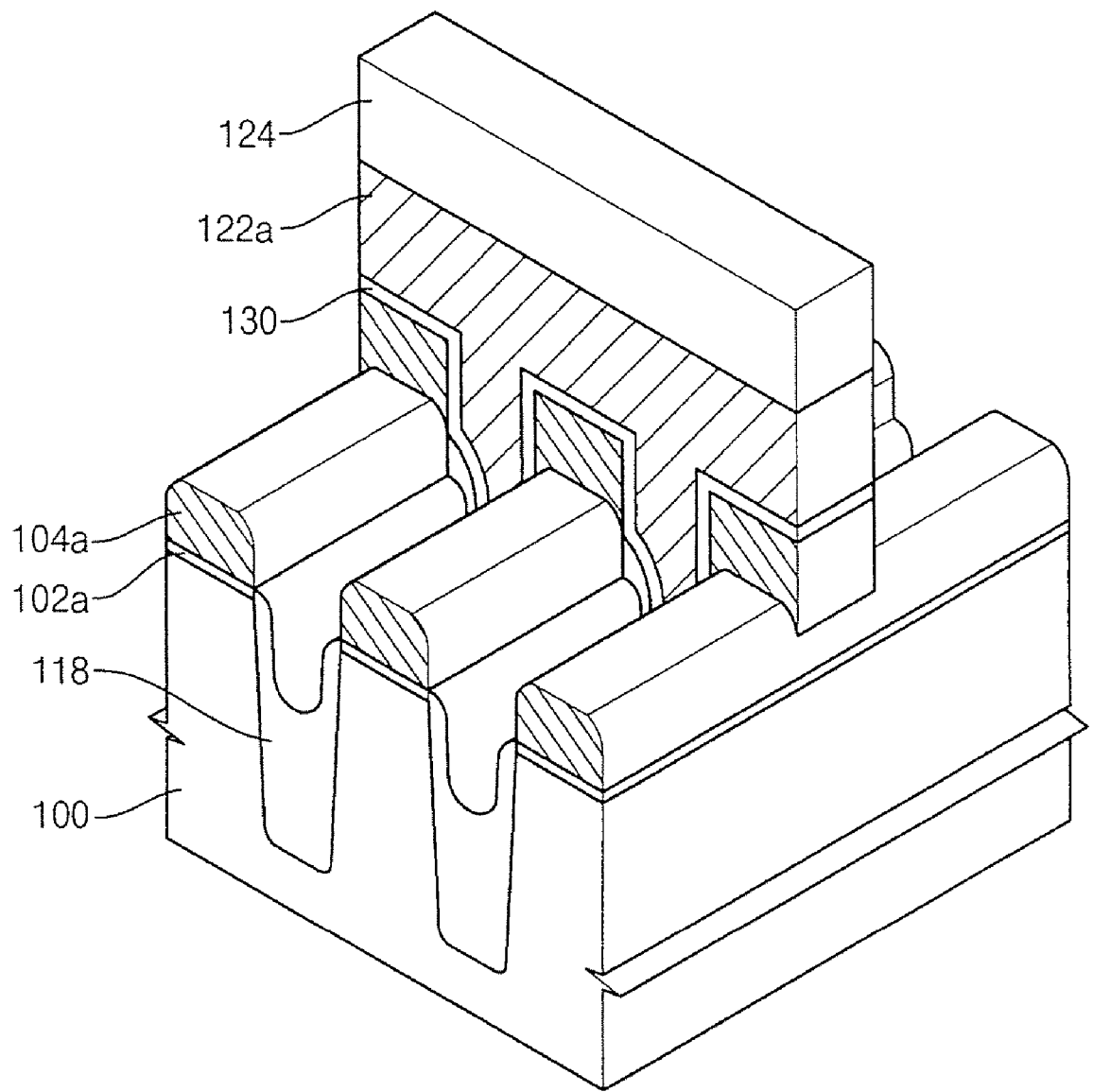

Referring to FIG. 18, the wing spacer 112 formed on the sidewalls of the first conductive layer pattern 104a is removed. While the wing spacer 112 is removed from the first conductive layer pattern 104a, upper surfaces of the isolation layer pattern 118 is partially removed together.

The wing spacer 112 may have an etch selectivity with respect to the first conductive layer pattern 104a. When the wing spacer 112 is removed, the first conductive layer pattern 104a may be required to not be removed. Accordingly, because the first conductive layer pattern 104a remains to protect the active region under the first conductive layer pattern 104a during the etch process of the wing spacer 112, the active region may be prevented from being damaged. The wing spacer 112 may be removed by a dry etch process using a series of a fluorocarbon gas as an etching gas. The examples of the fluorocarbon gas may be carbon tetrafluoride ($CF_4$), difluoromethane ($CH_2F_2$), octafluorocyclobutane ($C_4F_8$), etc. These may be used alone or as a combination thereof.

Since the wing spacer 112 is formed on the sidewalls of the first conductive layer pattern 104a, it is not difficult to completely remove the first conductive layer pattern 104a in a state where the wing spacer 112 remains. Accordingly, before the first conductive layer pattern 104a is etched, the wing spacer 112 is required to be removed.

Figure 19:
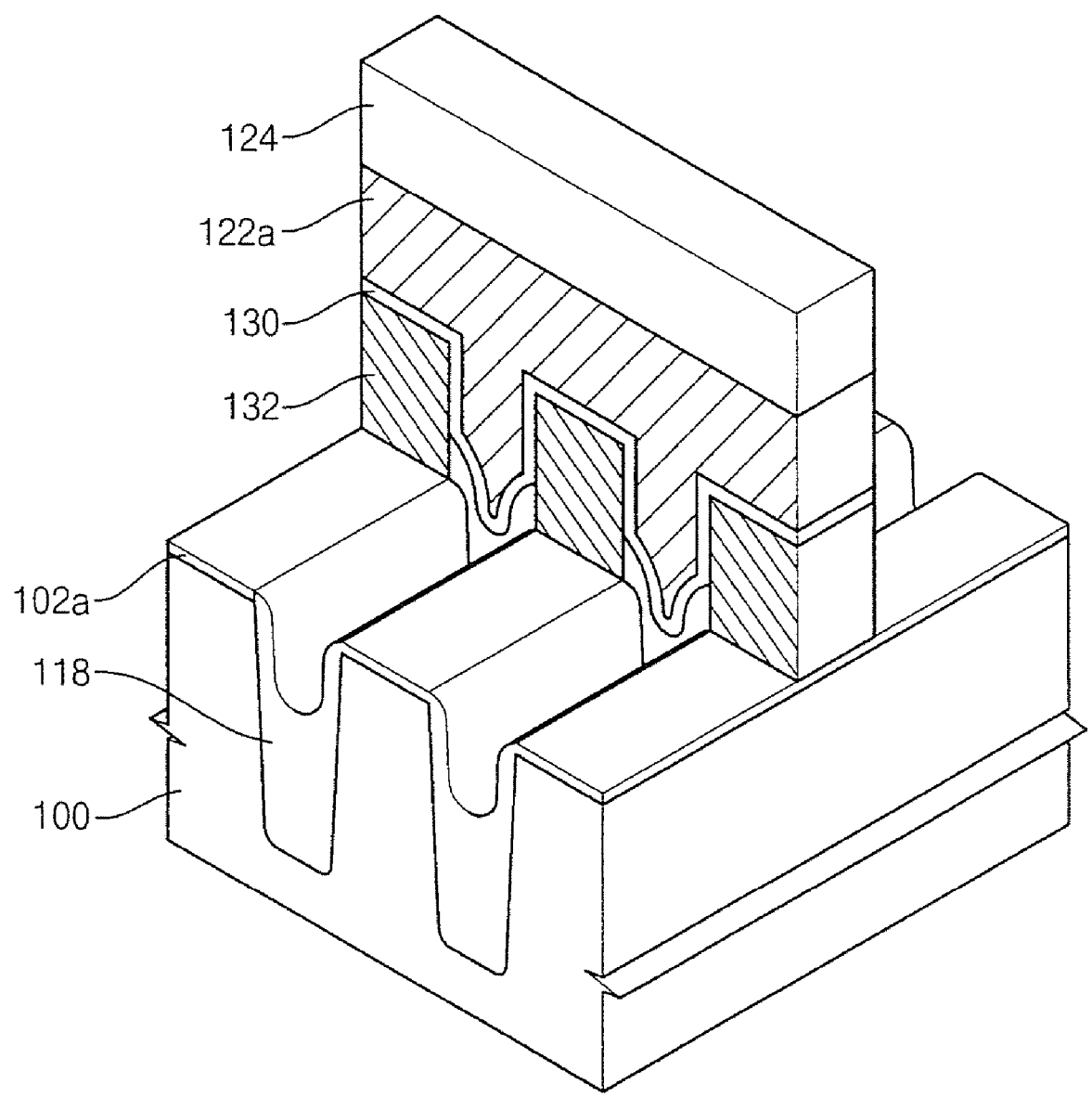

Referring to FIG. 19, the first conductive layer pattern 104a is etched to form a floating gate electrode 132 under the dielectric layer pattern 130.

As mentioned above, because the wing spacer 112 is already removed, the first conductive layer pattern 104a may be easily removed. Accordingly, a failure of a stringer, which occurs when the first conductive layer pattern 104a partially remains, may be reduced.

By the illustrated process, a gate structure including the tunnel oxide layer pattern 102a, the floating gate electrode 132, the dielectric layer pattern 130 and the control gate electrode 122a formed on the substrate 100 is completed.

Although not illustrated in the figures, impurities are doped into both surfaces adjacent to the gate structure to form impurity regions, to thereby complete a cell of a non-volatile memory device.

Embodiment IV

A method of forming a non-volatile semiconductor memory device in accordance with a fourth embodiment of the present invention is the same as Embodiment III, except that an argon sputtering process and an anisotropic etch process are performed repeatedly over the first dielectric layer. Also, the process where an argon sputtering process and an anisotropic etch process are performed repeatedly over the first dielectric layer is the same as the second embodiment and any further explanations with respect to the same processes will be omitted.

Embodiment V

FIGS. 20 to 24 are perspective views illustrating a method of forming a cell of a non-volatile memory device in accordance with a fifth embodiment of the present invention.

A method of forming a non-volatile semiconductor memory device in accordance with a fifth embodiment of the present invention is the same as Embodiment III, except that a wing spacer is not formed on sidewalls of the first conductive pattern. Thus, any further explanations with respect to the same processes will be omitted.

First, the same processes as illustrated in FIGS. 9 to 11 are performed to form an insulation layer pattern in FIG. 11. In this embodiment, since the wing spacer is not formed on the sidewalls of the first conductive layer pattern, the insulation layer pattern is used for the isolation layer pattern 110.

Figure 20:
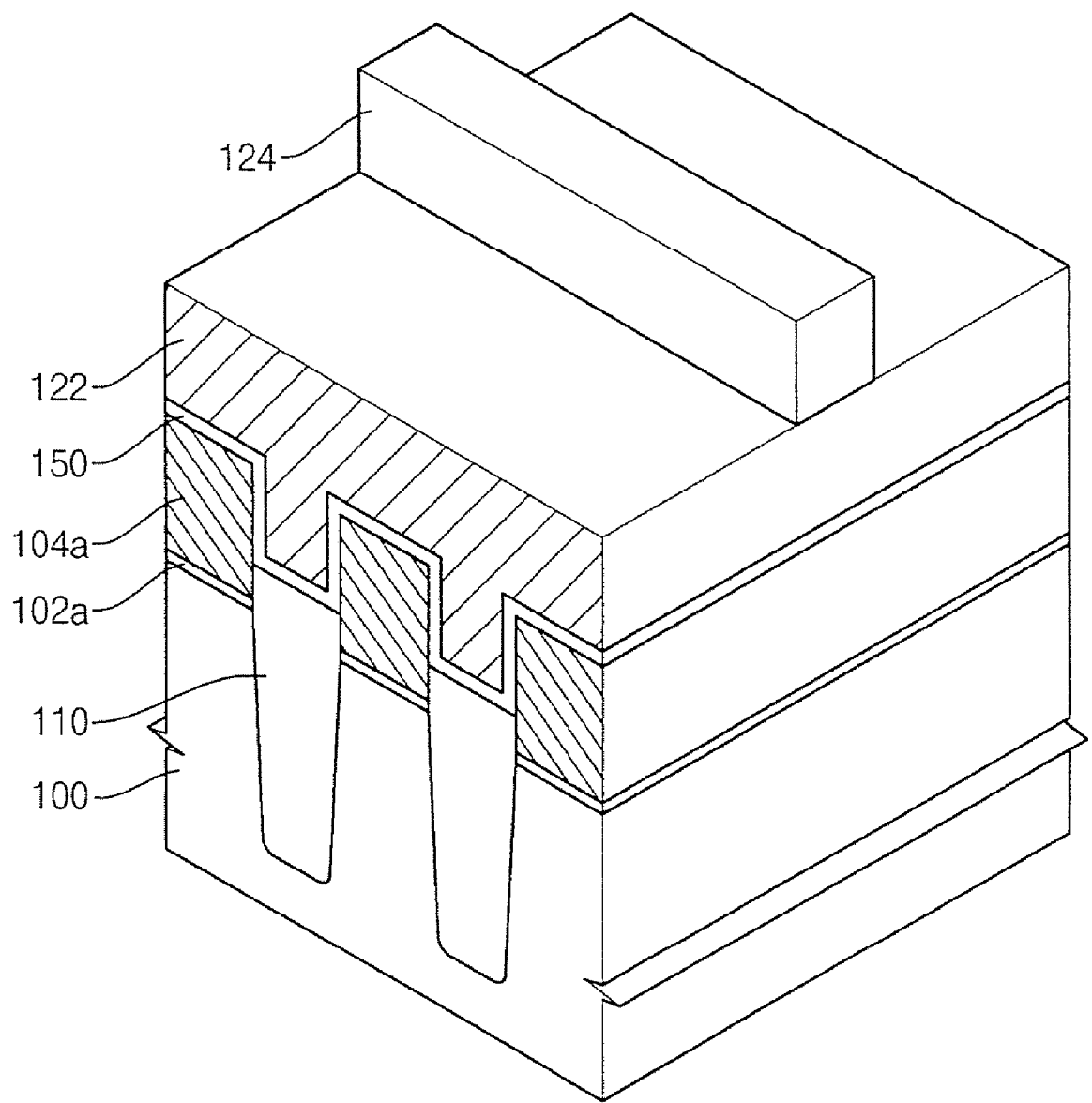

Referring to FIG. 20, a first dielectric layer 150 is formed on a first conductive layer pattern 104a and the isolation layer pattern 110. The first dielectric layer 150 may be formed using a metal oxide having a dielectric constant greater than silicon nitride. Examples of the metal oxide may be aluminum oxide, hafnium oxide, zirconium oxide, etc. Alternatively, silicon oxide, a metal oxide having a high dielectric constant and silicon oxide may be sequentially deposited on the substrate 100 to form the first dielectric layer 150.

A second conductive layer 122 to be used for a control gate electrode is formed on the first dielectric layer 150. The second conductive layer 122 may include a doped polysilicon, a metal, a metal silicide material, etc.

A second hard mask layer 124 is formed on the second conductive layer 122. For example, the second hard mask pattern 124 may extend in a direction perpendicular to an extending direction of the first conductive layer pattern 104a, as illustrated in FIG. 20.

Figure 21:
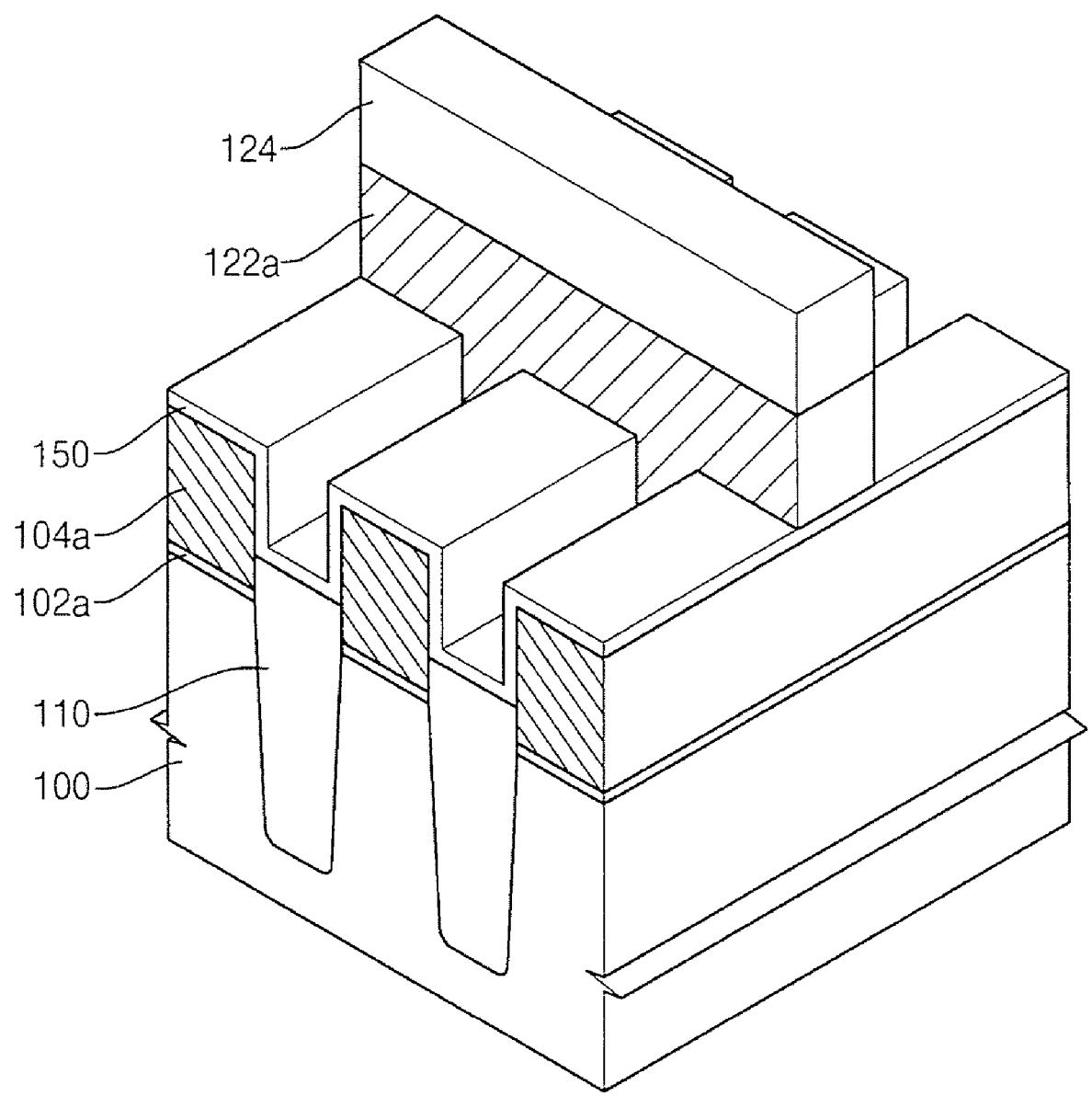

Referring to FIG. 21, the second conductive layer 122 is etched using the second hard mask pattern 124 as an etching mask to form a control gate electrode 122a. When the second conductive layer 122 is etched, the first dielectric layer 120 between the control gate electrodes 122a is exposed.

Figure 22:
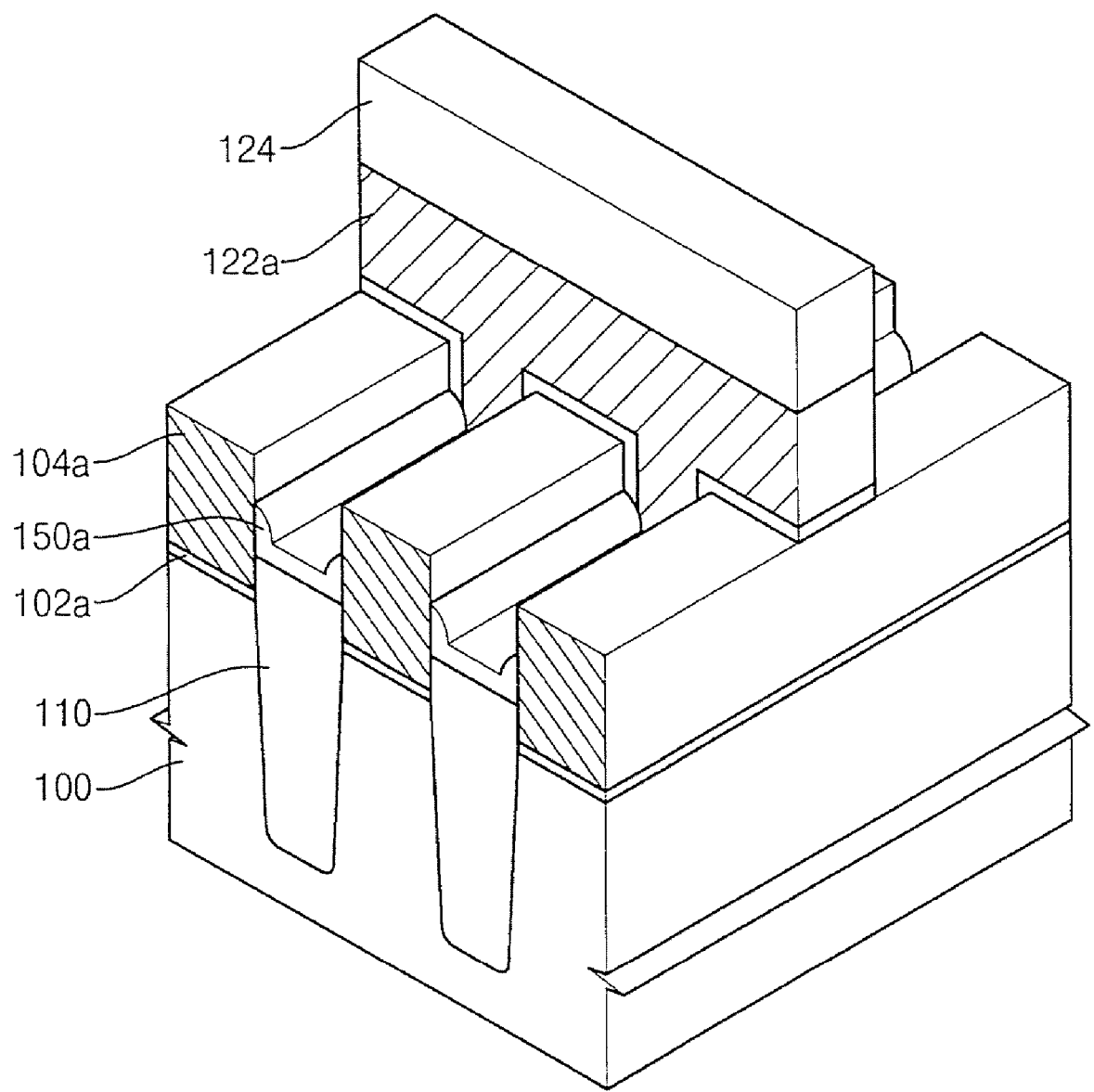

Referring to FIG. 22, the exposed first dielectric layer 150 is partially removed and the removed first dielectric layer is deposited on the first dielectric layer 150 between the first conductive layer pattern 104a to form a second dielectric layer 150a having a relatively greater thickness between the first conductive layer pattern 104a. Portions of the first dielectric layer 150 formed on an upper surface and upper sidewalls of the first conductive layer pattern 104a are almost removed to form the second dielectric layer 150a. The etch process for forming the second dielectric layer 150a may be the same as in Embodiment III.

Figure 23:
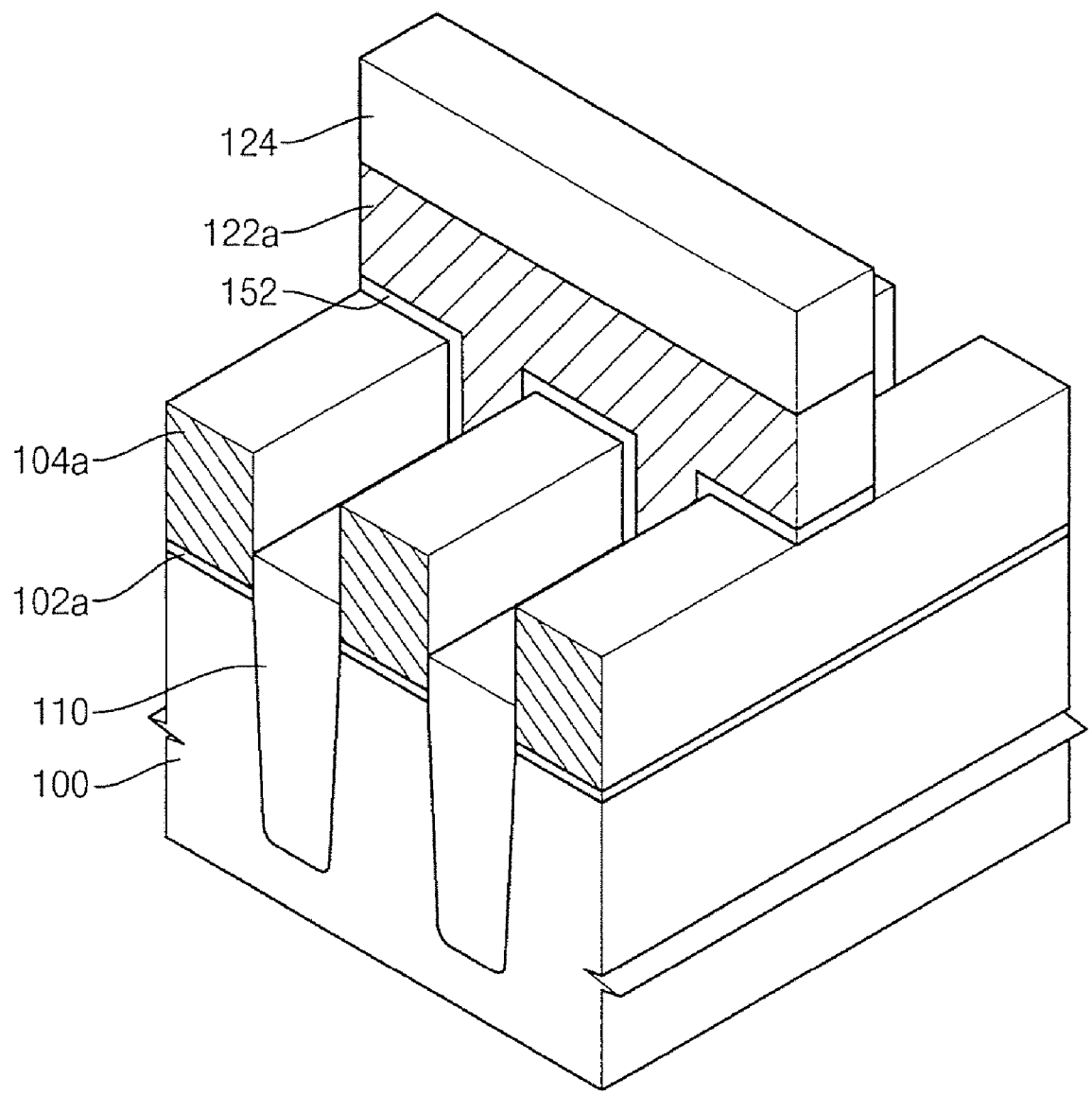

Referring to FIG. 23, the second dielectric layer 150a may be etched by an anisotropic etch process to form a dielectric layer pattern 152 under the control gate electrode 122a. The anisotropic etch process for forming the dielectric layer pattern 152 may be the same as in Embodiment III.

Figure 24:
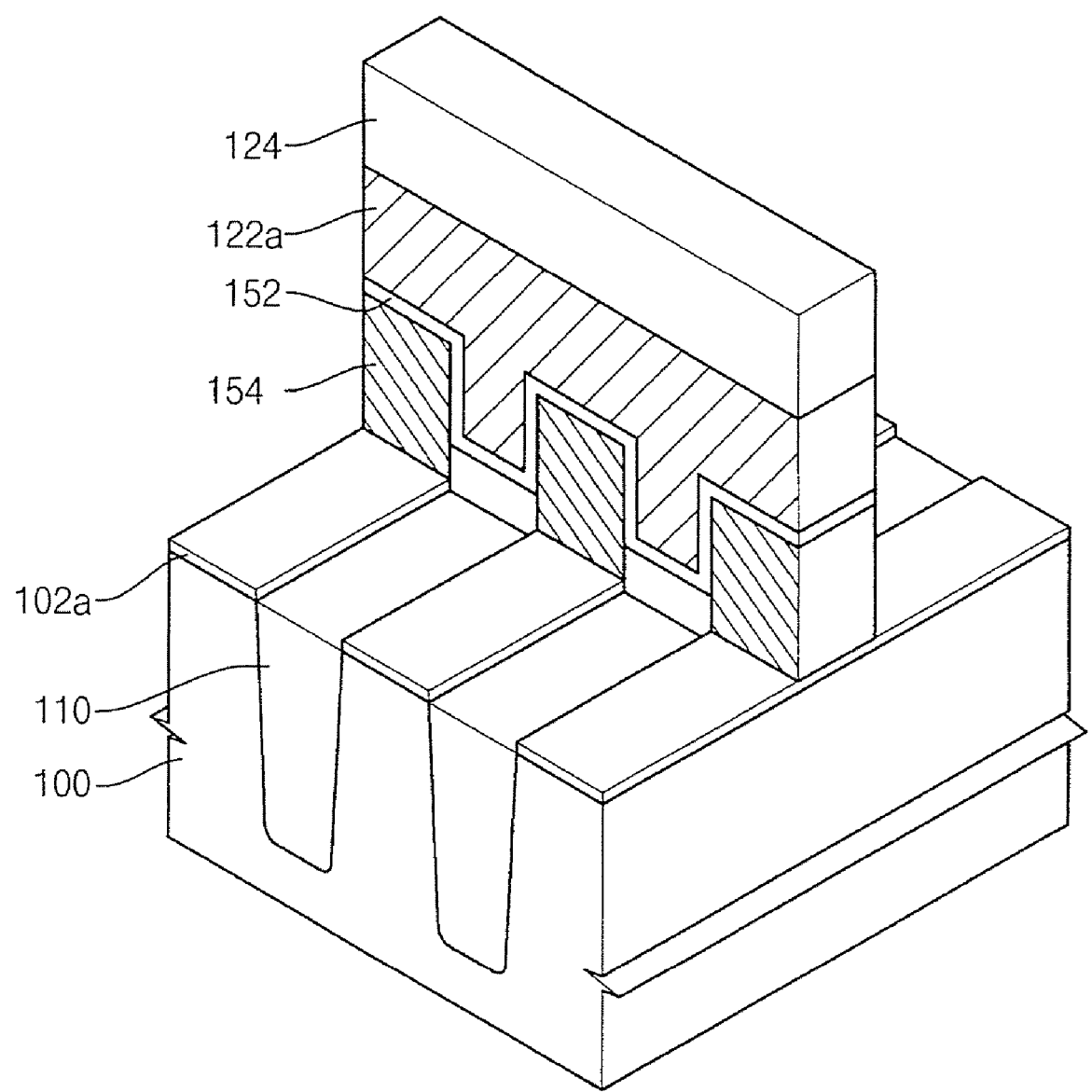

Referring to FIG. 24, the isolation layer pattern 110 formed on sidewalls of the first conductive layer pattern 104a is removed. The isolation layer pattern 110 may have an etch selectivity with respect to the first conductive layer pattern 104a. When the isolation layer pattern 110 is removed, the first conductive layer pattern 104a may be required to not be removed. The etch process for etching the isolation layer pattern 110 may be the same as the process for removing the wing spacer in Embodiment III.

Then, the first conductive layer pattern 104a is etched to form a floating gate electrode 154 under the dielectric layer pattern 152. By the process, a gate structure including the tunnel oxide layer pattern 102a, the floating gate electrode 154, the dielectric layer pattern 152 and the control gate electrode 122a formed on the substrate 100 is completed.

Although not illustrated in the figures, impurities are doped into both surfaces adjacent to the gate structure to form impurity regions, to thereby complete a cell of a non-volatile memory device.

As mentioned above, a method of forming a dielectric layer pattern according to some embodiments of the present invention may be actively used for forming a pattern including a metal oxide having a high dielectric constant. In particular, the method according to some example embodiments may be applicable to manufacture various semiconductor memory devices such as a cell transistor, a capacitor, etc., for which a dielectric layer having a high dielectric constant is required.

The foregoing is illustrative of exemplary embodiments and is to not be construed as limiting thereof. Although a few exemplary embodiments have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. Therefore, it is to be understood that the foregoing is illustrative of various exemplary embodiments and is to not be construed as limited to the specific exemplary embodiments disclosed, and that modifications to the disclosed example embodiments, as well as other exemplary embodiments, are intended to be included within the scope of the appended claims.

What is claimed is:

1. A method of forming a dielectric layer pattern, comprising:
   forming lower patterns on a substrate;
   forming a first dielectric layer on sidewalls and upper surfaces of the lower patterns and a surface of the substrate;
   forming a mask pattern on the first dielectric layer to partially expose the first dielectric layer;
   partially removing the exposed first dielectric layer on upper surfaces and upper sidewalls of the lower patterns and depositing the removed first dielectric layer on surfaces of the first dielectric layer between the lower patterns, to form a second dielectric layer having a thickness greater than that of the first dielectric layer from the substrate; and
   etching the second dielectric layer on the sidewalls of the lower patterns and the substrate to form a dielectric layer pattern under the mask pattern.

2. The method of claim 1, wherein the first dielectric layer comprises a metal oxide having a greater dielectric constant than silicon nitride.

3. The method of claim 2, wherein the first dielectric layer comprises at least one selected from the group consisting of aluminum oxide, hafnium oxide and zirconium oxide.

4. The method of claim 1, wherein forming the second dielectric layer comprises performing an argon sputtering process over the first dielectric layer.

5. The method of claim 4, wherein the argon sputtering process is performed under a pressure of about $_{20}$ mTorr to about $_{40}$ mTorr and at a bias voltage of about $_{100}$ V to about $_{900}$ V.

6. The method of claim 1, wherein etching the second dielectric layer comprises anisotropically etching the second dielectric layer.

7. The method of claim 1, wherein the second dielectric layer is etched using an etching gas comprising at least one selected from the group consisting of chlorine (Cl2), boron trichloride (BCl3) and hydrogen bromide (HBr).

8. The method of claim 1, wherein forming the second dielectric layer and etching the second dielectric layer are sequentially performed repeatedly.

9. A method of manufacturing a non-volatile memory device, comprising:
   forming a tunnel oxide layer and a conductive layer pattern on a substrate;
   forming a first dielectric layer on a surface of the conductive layer pattern and a surface of the substrate;
   forming a control gate electrode on the first dielectric layer to partially expose the first dielectric layer;
   partially removing the exposed first dielectric layer on an upper surface and upper sidewalls of the conductive layer pattern between the control gate electrodes and depositing the removed first dielectric layer on a surface of the first dielectric layer between the conductive layer patterns, to form a second dielectric layer having a thickness greater than that of the first dielectric layer from the substrate;
   etching the second dielectric layer on the sidewalls of the conductive layer pattern and the substrate to form a dielectric layer pattern; and
   etching the exposed conductive layer pattern between by the control gate electrodes to form a floating gate electrode.

10. The method of claim 9, further comprising forming an isolation layer pattern in the substrate between the conductive layer patterns.

11. The method of claim 9, wherein forming the isolation layer pattern comprises:
   etching the substrate between the conductive layer pattern to form an isolation trench;
   filling the trench and a gap between the conductive layer patterns with an insulation layer to form a preliminary isolation layer pattern; and etching the preliminary isolation layer pattern to partially expose the sidewalls of the conductive layer patter to form the isolation layer pattern.

12. The method of claim 11, further comprising forming a wing spacer on the isolation layer pattern to partially cover the sidewalls of the conductive layer pattern.

13. The method of claim 11, further comprising partially removing the isolation layer pattern, after forming the dielectric layer pattern.

14. The method of claim 9, wherein the first dielectric layer comprises a metal oxide having a greater dielectric constant than silicon nitride.

15. The method of claim 14, wherein the first dielectric layer comprises at least one selected from the group consisting of aluminum oxide, hafnium oxide and zirconium oxide.

16. The method of claim 14, wherein silicon oxide, the metal oxide and silicon oxide are sequentially stacked to form the first dielectric layer.

17. The method of claim 9, wherein forming the second dielectric layer comprises performing an argon sputtering process over the first dielectric layer.

18. The method of claim 9, wherein etching the second dielectric layer comprises anisotropically etching the second dielectric layer.

19. The method of claim 18, wherein the second dielectric layer is etched using an etching gas comprising at least one selected from the group consisting of chlorine (Cl2), boron trichloride (BCl3), and hydrogen bromide (HBr).

20. The method of claim 9, wherein forming the floating gate electrode comprises performing a dry etch process using an etching gas including a series of a fluorocarbon over the conductive layer pattern.

21. The method of claim 20, wherein the etching gas including a series of a fluorocarbon comprises at least one selected from the group consisting of carbon tetrafluoride (CF4), difluoromethane (CH2F2) and octafluorocyclobutane (C4F8).

22. The method of claim 9, wherein forming the second dielectric layer and etching the second dielectric layer are sequentially performed repeatedly, before forming the floating gate pattern.

* * * * *